(12) United States Patent
Schoner

(10) Patent No.: US 7,205,804 B2
(45) Date of Patent: Apr. 17, 2007

(54) METHODS AND SYSTEM FOR REDUCING EFFECTS OF DIGITAL LOOP DEAD ZONES

(75) Inventor: Brian Schoner, Fremont, CA (US)

(73) Assignee: Broadcom Corporation, Irvine, CA (US)

(*) Notice: Subject to any disclaimer, the term of this patent is extended or adjusted under 35 U.S.C. 154(b) by 185 days.

(21) Appl. No.: 10/948,572

(22) Filed: Sep. 24, 2004

(65) Prior Publication Data

US 2005/0225367 A1  Oct. 13, 2005

Related U.S. Application Data

(60) Provisional application No. 60/561,156, filed on Apr. 12, 2004.

(51) Int. Cl.
*H03L 7/06* (2006.01)
(52) U.S. Cl. ........................... 327/158; 327/149
(58) Field of Classification Search ............... None
See application file for complete search history.

(56) References Cited

U.S. PATENT DOCUMENTS 5,588,025 A * 12/1996 Strolle et al. ............... 375/316
6,577,257 B2   6/2003 Brooks ........................ 341/131
6,903,615 B2 *  6/2005 Landman et al. ............. 331/57
2002/0033737 A1 *  3/2002 Staszewski et al. ........... 331/17

* cited by examiner

*Primary Examiner*—Timothy P. Callahan
*Assistant Examiner*—Cassandra Cox
(74) *Attorney, Agent, or Firm*—Sterne Kessler Goldstein & Fox PLLC

(57) ABSTRACT

Methods and systems for reducing effects of digital loop dead zones add phase randomness to one or more asynchronous signals that are to be synchronized with a digital loop system clock. Phase randomness is added in one or more of a variety of ways including, without limitation, non-harmonic asynchronous signals and variable phase delay. The invention can be implemented in a variety of types of digital loops including, without limitation, phase locked loops ("PLLs"). For example, a PLL receives a system clock signal, a digital reference signal, and a feedback signal. The digital reference signal and/or the feedback signal is asynchronous with the system clock signal. A phase of the asynchronous signal(s) is randomized and then synchronized with the system clock signal, prior to phase difference detection. This reduces effects of digital loop dead zones that are otherwise introduced by synchronization. The phase difference between the reference signal and the feedback signal is used to control a numerically controlled oscillator ("NCO"), which outputs the feedback signal. The NCO controls the feedback signal to minimize the phase difference.

16 Claims, 5 Drawing Sheets

METHODS AND SYSTEM FOR REDUCING EFFECTS OF DIGITAL LOOP DEAD ZONES

CROSS REFERENCE TO RELATED APPLICATIONS

This application claims the benefit of priority to U.S. Provisional Patent Application No. 60/561,156 filed Apr. 12, 2004, which is incorporated herein by reference in its entirety.

BACKGROUND OF THE INVENTION

1. Field of the Invention

The present invention is directed to digital loops and, more particularly, to reduction of effects of digital loop dead zones.

2. Related Art

Digital loops, such as phase locked loops ("PLLs"), operate at discrete time intervals, marked by clock edges. When an asynchronous signal, such as a feedback signal and/or a digital reference signal, is synchronized with a digital loop system clock, information is essentially truncated to the nearest system clock. As a result, conventional digital loops can only measure the phase of the signal to the nearest clock edge. Conventional digital loops cannot distinguish phase changes in regions centered between clock edges. The central region is thus referred to herein as a dead zone. The dead zones are essentially equal to the clock period.

Digital loop dead zones cause non-ideal loop behavior and result in a loss of phase information. For example, when a digital loop is locked, the loop tends to wander about the dead zone. Additionally, when the reference signal changes, the loop takes longer to respond to the change.

What are needed, therefore, are methods and systems for reducing effects of digital loop dead zones.

SUMMARY OF THE INVENTION

The present invention is directed to methods and systems for reducing effects of digital loop dead zones. In accordance with the invention, phase randomness is added to one or more asynchronous signals that are to be synchronized with a digital loop system clock. Phase randomness is added in one or more of a variety of ways including, without limitation, non-harmonic asynchronous signals and variable phase delay.

The invention can be implemented in a variety of types of digital loops including, without limitation, PLLs. For example, a PLL receives a system clock signal, a digital reference signal, and a feedback signal. The digital reference signal and/or the feedback signal is asynchronous with the system clock signal. A phase of the asynchronous signal(s) is randomized and then synchronized with the system clock signal, prior to phase difference detection. This reduces effects of digital loop dead zones that are otherwise introduced by synchronization. The phase difference between the reference signal and the feedback signal is used to control a numerically controlled oscillator ("NCO"), which outputs the feedback signal. The NCO controls the feedback signal to minimize the phase difference.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing summary and the following detailed description are exemplary and explanatory and are intended to provide further explanation of the invention as claimed.

BRIEF DESCRIPTION OF THE DRAWINGS/FIGURES

The present invention will be described with reference to the accompanying drawings, wherein like reference numbers indicate identical or functionally similar elements. Also, the leftmost digit(s) of the reference numbers identify the drawings in which the associated elements are first introduced.

DETAILED DESCRIPTION OF THE INVENTION

The present invention is directed to methods and systems for reducing effects of digital loop dead zones. The present invention is applicable to a variety of types of digital loops including, without limitation, phase locked loops ("PLLs").

Figure 1:
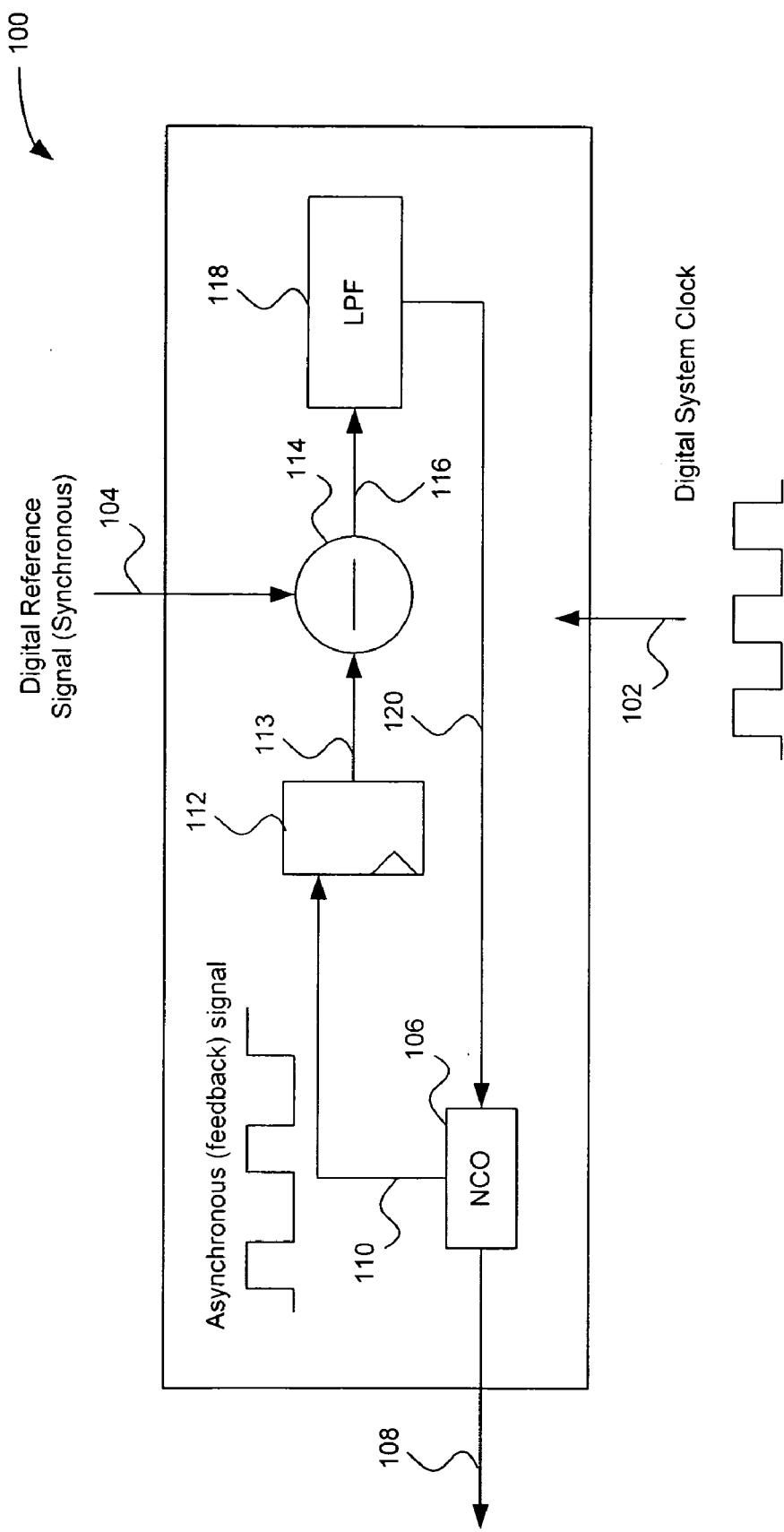
FIG. 1 is a high-level block diagram of a PLL 100.

FIG. 1 is a high-level block diagram of a PLL 100. The PLL 100 receives a digital system clock 102 and a digital reference signal 104. The PLL 100 includes a numerically controlled oscillator 106 that outputs a digital clock signal 108, which is to be phase locked with the digital reference signal 104.

In order to phase lock the digital clock signal 108 with the digital reference signal 104, the NCO 106 outputs a feedback signal 110, which can be the digital clock signal 108, or a harmonic or sub-harmonic thereof.

In the example of FIG. 1, the digital reference signal 104 is synchronous with the digital system clock 102, and the NCO feedback signal 110 is asynchronous with the digital system clock 102. Alternatively, the digital reference signal 104 is asynchronous with the digital system clock 102. Alternatively, the digital reference signal 104 and the NCO feedback signal 110 are both asynchronous with the digital system clock 102.

For the example of FIG. 1, a synchronizer 112 synchronizes the NCO feedback signal 110 with the digital system clock 102. The synchronizer 112 outputs a synchronized NCO signal 113. A phase detector 114 detects a phase difference between the synchronized NCO signal 113 and the digital reference signal 104. The phase detector 114 outputs a phase difference signal 116 to a digital low pass filter 118. The digital low pass filter 118 smoothes changes in the phase difference signal 116. The digital low pass filter 118 outputs a NCO control signal 120 to the NCO 106. The NCO control signal 120 controls the NCO 106 to adjust the NCO feedback signal 110, so as to minimize a phase difference between the synchronized NCO signal 113 and the digital reference signal 104.

The PLL 100 operates at discrete time intervals, marked by clock edges of the system clock 102. When the NCO feedback signal 110 is synchronized with the system clock 102, information in the NCO feedback signal 110 is essentially truncated to the nearest system clock 102. As a result, the phase detector 114 can only measure the phase of the synchronized feedback signal 113 to the nearest clock edge of the system clock 102. This phenomenon is described below with reference to FIG. 2.

Figure 2:
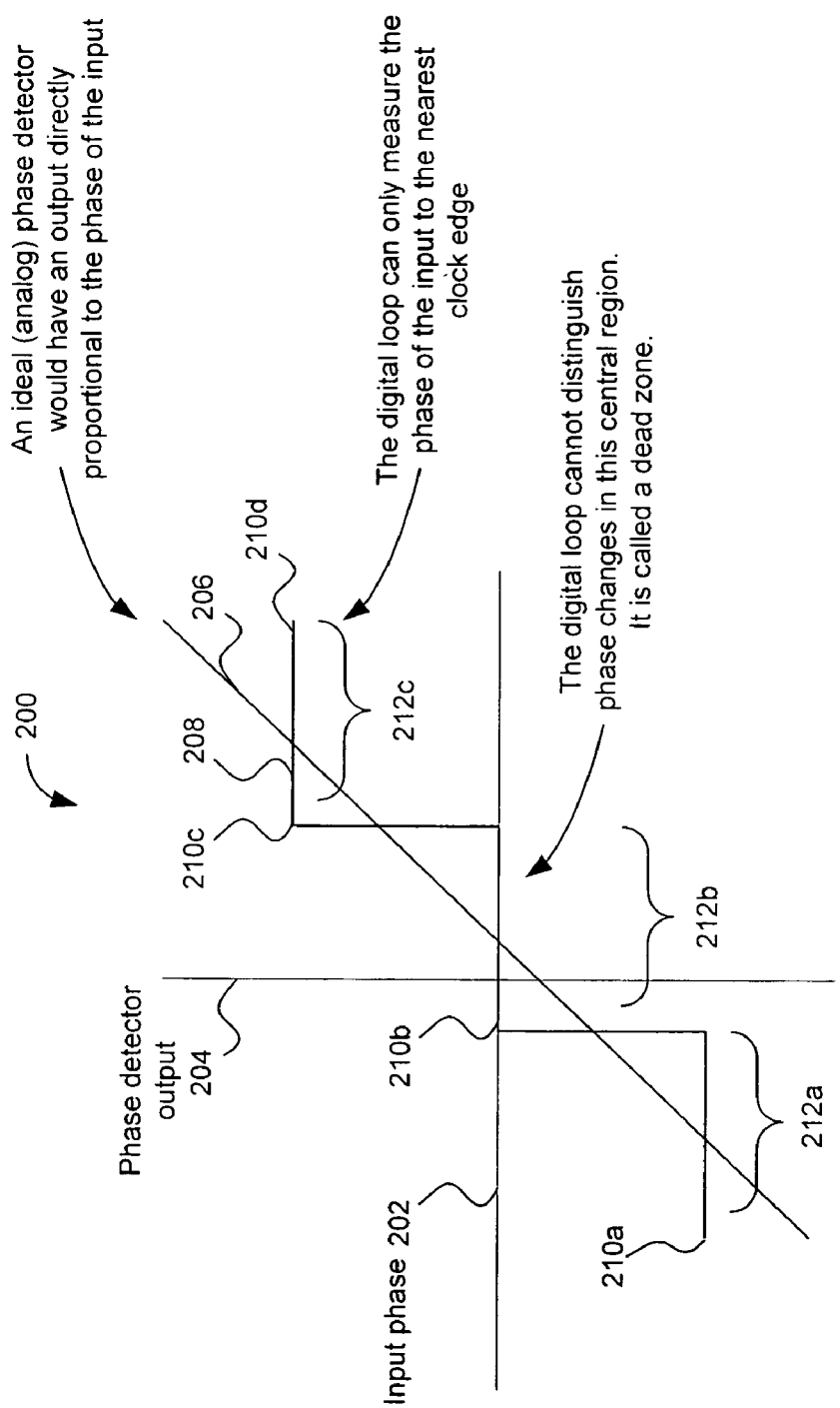
FIG. 2 is a graph 200 that compares digital loop phase detection with idealized analog phase detection.

FIG. 2 is a graph 200 that compares digital loop phase detection with idealized analog phase detection. The graph 200 includes an input phase axis 202 and a phase detector output axis 204. The graph 200 contrasts an idealized analog phase detector response 206 with an example digital phase detector response 208. The idealized analog phase detector response 206 is directly proportional to the input phase axis 202. In other words, the idealized analog phase detector response 206 increases in proportion to input phase increases.

A conventional digital loop, on the other hand, can only measure the input phase to a nearest clock edge 210. For example, referring to FIG. 1, when the NCO feedback signal 110 is synchronized in the synchronizer 112, the information is essentially truncated to the nearest system clock. This leads to a loss of phase information, which causes the phase detector to have the quantized appearance of the digital phase detector response 208. A conventional loop thus cannot distinguish between phase changes in central regions 212. Central regions 212 are thus referred to herein as dead zones.

Digital loop dead zones 212 cause non-ideal loop behavior. For example, when a digital loop is locked, the loop tends to wander about the dead zones 212. Additionally, when the reference signal changes, the loop takes longer to respond to the change.

In the example of FIG. 1, the NCO 106 is asynchronous with the system clock signal 102, and the problems described above with respect to FIG. 2 arise primarily as a result of the synchronizer 112. In other situations, the digital reference signal 104 is asynchronous with the system clock signal 102, and similar problems arise when synchronizing the digital reference signal 104 to the system clock signal 102. In yet other situations, both the NCO 106 and the digital reference signal 104, and/or other signals in a digital loop are asynchronous with the system clock signal 102.

Figure 3:
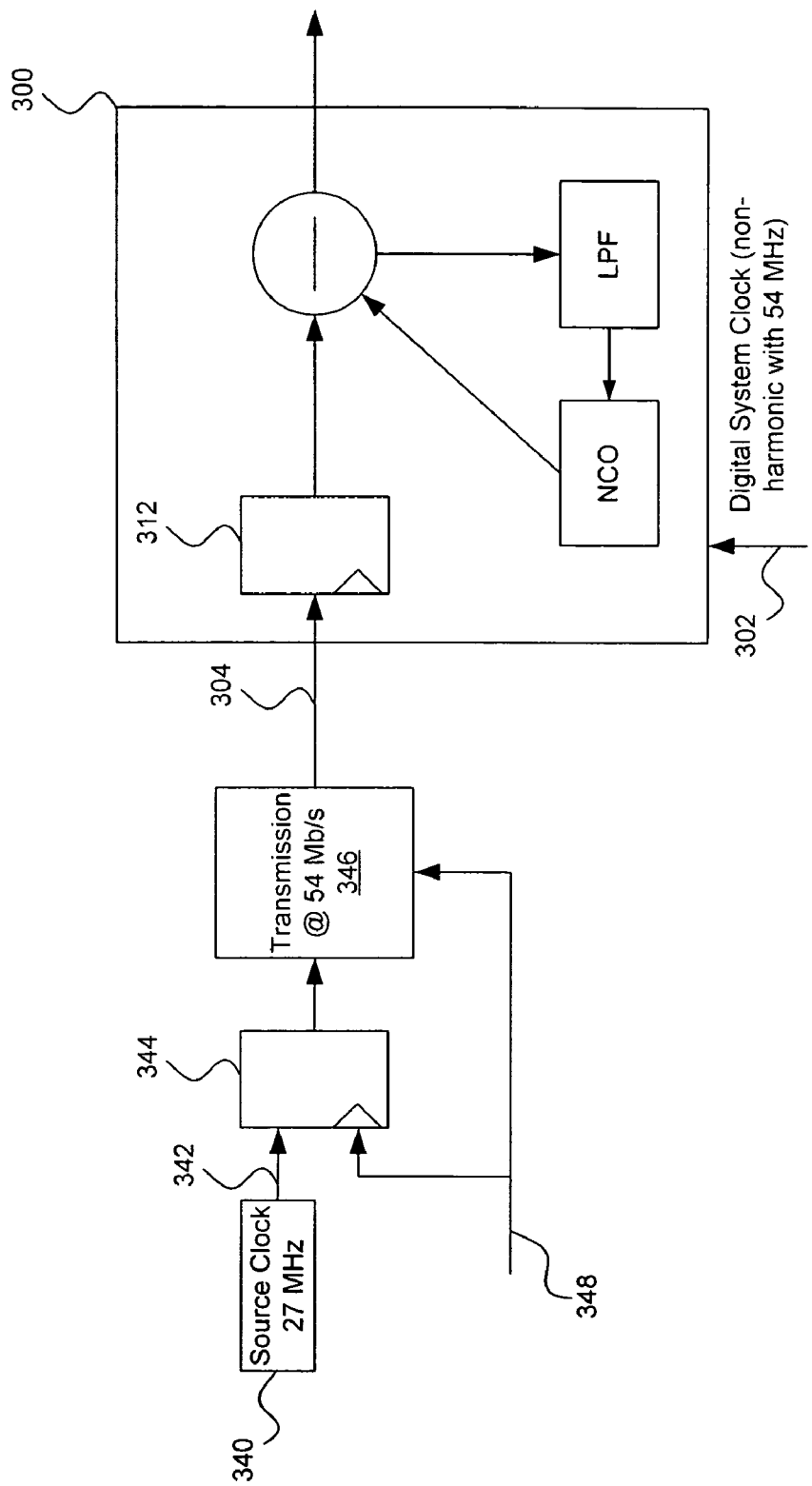
FIG. 3 is a block diagram of a PLL 300 that receives an asynchronous digital reference signal 304.

For example, FIG. 3 is a block diagram of a PLL 300 that receives an asynchronous digital reference signal 304. The asynchronous digital reference signal 304 is generated from a source clock 340, illustrated here as a 27 MHz source clock. The source clock 340 outputs a source clock signal 342 that is asynchronous with the system clock 302. The source clock signal 342 can be associated with, for example, a video transmission, such as a video transmission encoded in accordance with the Moving Picture Experts Group ("MPEG") standard.

A transmitter 346 receives the source clock signal 342 and transmits it to the PLL 300 as reference signal 304. The transmitter 346 is controlled by a transmission clock signal 348, which is typically different than the clock signal 342. The source clock signal 342 is synchronized with the transmission clock signal 348 by a synchronizer 344.

The reference signal 304 is then synchronized with the system clock 302 by a second synchronizer 312. As described above with reference to FIG. 2, phase information tends to be lost during synchronization in the synchronizer 344 and/or in the synchronizer 312

Reducing Dead Zone Effects with Phase Randomness

In accordance with the invention, phase randomness is added to one or more asynchronous signals that are to be synchronized with a digital loop system clock. Phase randomness is added in one or more of a variety of ways. Example methods and systems for adding phase randomness are described herein, including non-harmonic asynchronous signals and variable phase delay. The invention is not, however, limited to the examples provided herein. Based on the disclosure herein, one skilled in the relevant art(s) will understand that there are other ways of introducing phase randomness, in accordance with the present invention.

Non-Harmonic Asynchronous Signals

Effects of digital loop dead zones tend to be more pronounced when the asynchronous signal (e.g., asynchronous feedback signal and/or asynchronous reference signal), has a harmonic frequency relationship with the system clock. For example, in FIG. 1, when asynchronous NCO feedback signal 110 has a frequency that is the same, or nearly the same as the system clock 102, the dead zone effect is more pronounced. When the asynchronous NCO frequency is, for example, ⅕ the system clock, the dead zone effect is less pronounced. Accordingly, non-harmonic versions of asynchronous signals are used in place of harmonic versions.

Figure 4:
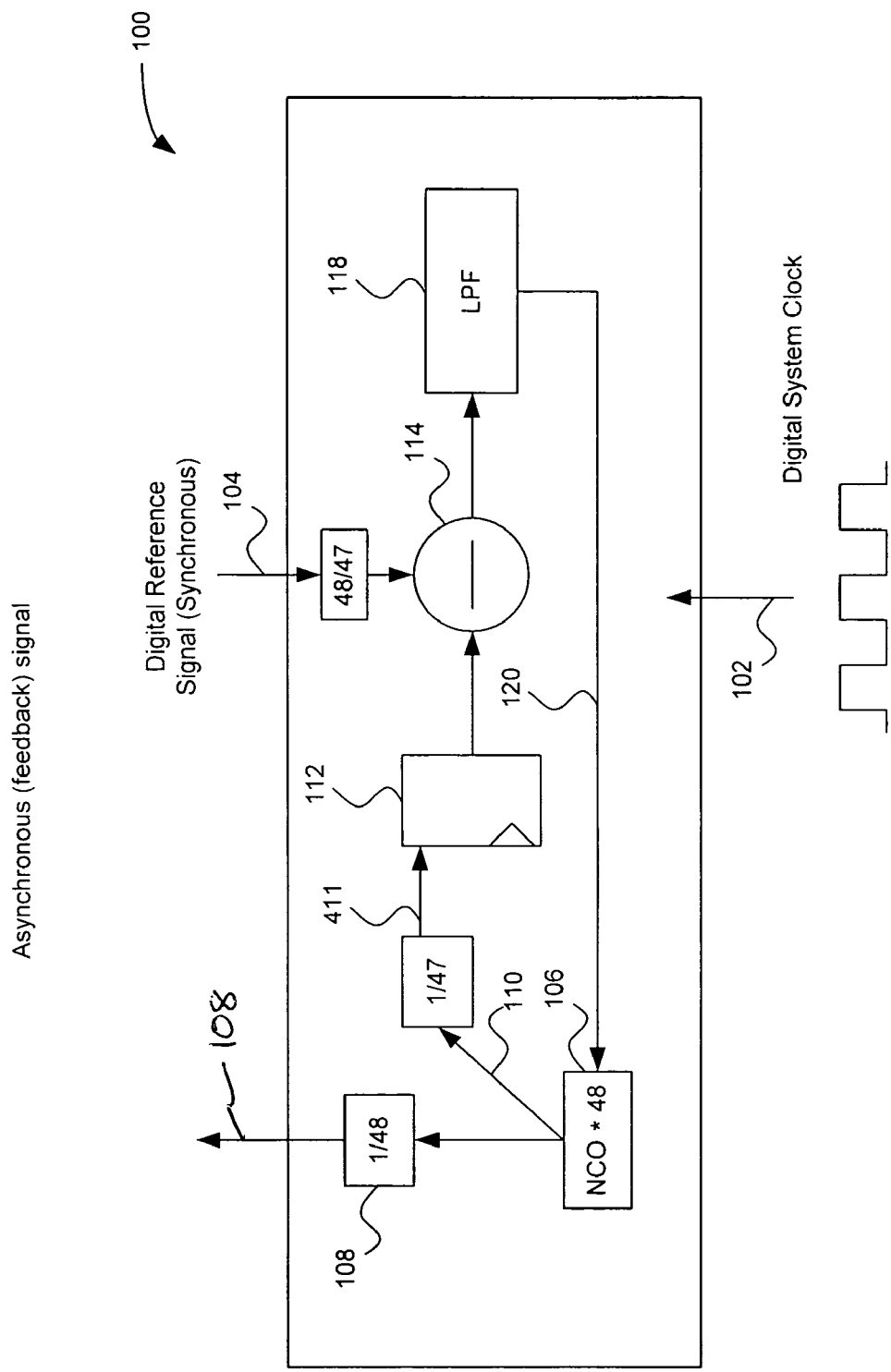
FIG. 4 is a block diagram of the PLL 100, wherein non-harmonic NCO feedback is utilized to reduce the effects of dead zones.

FIG. 4 illustrates the PLL 100, wherein non-harmonic NCO feedback is utilized to reduce the effects of dead zones. In FIG. 4, the NCO 106 includes frequency multiplier circuitry that multiplies the feedback frequency by a factor of X, illustrated here as 48. The resultant NCO feedback signal 110 is then divided by a factor of Y, illustrated here as 47. The resulting NCO feedback signal 411 thus has a frequency that is a non-harmonic fraction, X/Y, of the system clock 102. The reference signal 104 is also converted by the factor of X/Y.

Using non-harmonic feedback more evenly distributes phase information of the NCO feedback signal throughout the system clock period. A similar effect can be achieved by adding randomly variable phase delay, as described below.

Where it is desired to have an NCO output having a frequency that is harmonic with the system clock, one or more additional divider circuits can be utilized, such as divider circuit 410.

The example of FIG. 4 utilizes and example non-harmonic fraction X/Y of 48/47. The invention is not, however, limited to this example. Based on the description herein, one skilled in the relevant art(s) will understand that other non-harmonics can be utilized.

Variable Phase Delay

In addition to non-harmonic asynchronous signals, or as an alternative, phase randomness can be inserted with variable phase delay. Where dead zones result from asynchronous reference signals, as illustrated in FIG. 3, phase randomness can be inserted directly into the source clock 340, provided that the designer has control over the source clock 340. Alternatively, in FIG. 5, variable phase delay is inserted into the source clock signal 342 using a randomly variable delay circuit 502. Randomly variable phase delay has the effect of phase randomness.

Figure 5:
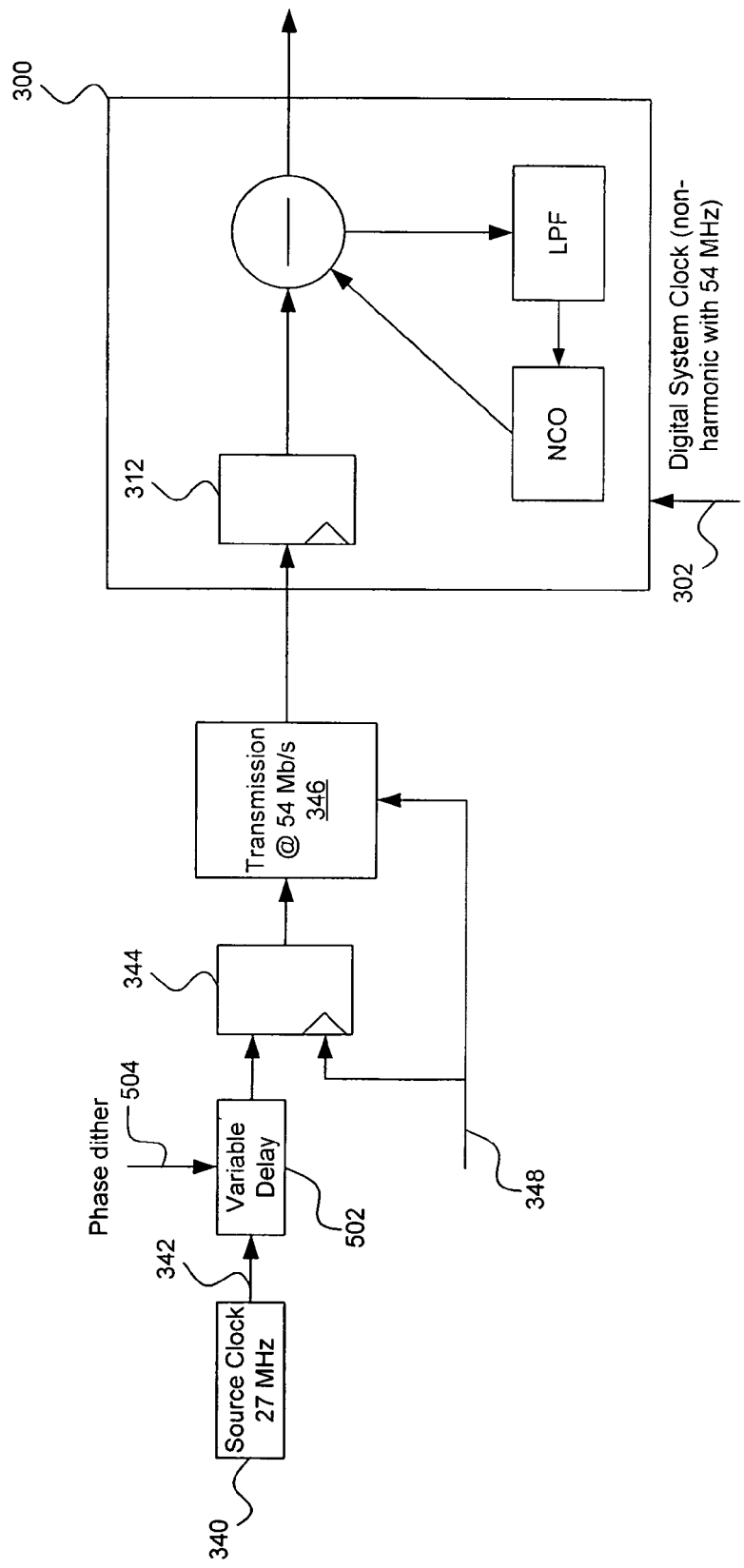
FIG. 5 is a block diagram of the PLL 300, wherein variable phase delay is utilized to reduce the effects of dead zones.

In the example of FIG. 5, the variable phase delay circuit 502 is controlled by a dither signal 504. The dither signal 504 can be based on analog or digital dither. Methods and systems for analog dithering are well known. Methods and systems digital dithering are taught in, for example, U.S. Pat.

No. 6,577,257, titled, "Methods and Systems for Digital Dither," issued to Brooks on Jun. 10, 2003, incorporated herein by reference in its entirety.

Alternatively, or additionally, the source clock signal 342 is converted to a non-harmonic of the system clock 302, as described above. For example, the source clock signal 342 can be converted to 27.1 MHz on the transmission side, and converted back to 27 MHz on the receiver side.

CONCLUSIONS

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like and combinations thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method of reducing digital loop dead zones, comprising:
   receiving a system clock signal;
   receiving a digital reference signal that is synchronised to the system clock signal;
   receiving a feedback signal that is asynchronous with the system clock signal;
   randomizing a phase of the feedback signal;
   synchronizing the randomized-phase feedback signal with the system clock signal;
   generating a phase difference signal indicative of a phase difference between the synchronised randomized-phase feedback signal and the digital feedback signal; and
   controlling a numerically controlled oscillator with the phase difference signal;
   wherein an output signal of the numerically controlled oscillator forms the feedback signal;
   wherein the numerically controlled oscillator adjusts the feedback signal to minimise the phase difference.

2. The method according to claim 1, wherein the randomizing includes converting the feedback signal to a non-harmonic frequency of the system clock signal, wherein the receiving of the digital reference signal includes converting the digital reference signal to the non-harmonic frequency, and wherein the generating of the phase difference signal includes detecting a phase difference between the non-harmonic synchronised randomized-phase feedback signal and the non-harmonic digital reference signal.

3. The method according to claim 2, further comprising outputting a second signal from the numerically controlled oscillator;
   wherein the second signal is phase locked with the first output signal of the numerically controlled oscillator;
   wherein the second signal has a data rate that is a harmonic of the system clock signal.

4. The method according to claim 1, wherein the randomizing of the phase of the feedback signal comprises variably delaying the phase of the feedback signal.

5. The method according to claim 4, wherein the randomizing of the phase of the feedback signal further comprises variably delaying the phase of the feedback signal under control of a dither signal.

6. A method of reducing digital loop dead zones, comprising:
   receiving a system clock signal;
   receiving a digital reference signal that is asynchronous with the system clock signal;
   receiving a feedback signal that is synchronised to the system clock signal;
   randomizing a phase of the digital reference signal;
   synchronizing the randomized-phase digital reference signal with the system clock signal;
   generating a phase difference signal indicative of a phase difference between the feedback signal and the synchronised randomized-phase digital feedback signal; and
   controlling a numerically controlled oscillator with the phase difference signal;
   wherein an output signal of the numerically controlled oscillator forms the feedback signal;
   wherein the numerically controlled oscillator adjusts the feedback signal to minimise the phase difference.

7. The method according to claim 6, wherein the randomizing of the phase of the digital reference signal comprises variably delaying the phase of the digital reference signal.

8. The method according to claim 7, wherein the randomizing of the phase of the digital reference signal further comprises variably delaying the phase of the digital reference signal under control of a dither signal.

9. The method according to claim 6, wherein the randomizing of the phase of the digital reference signal includes converting the digital reference signal to a non-harmonic frequency of the system clock, wherein the receiving of the digital reference signal includes converting the feedback signal to the non-harmonic frequency, and wherein the generating of the phase difference signal includes detecting a phase difference between the non-harmonic feedback signal and the non-harmonic synchronised randomized-phase digital reference signal.

10. The method according to claim 9, further comprising:
    outputting a second signal from the numerically controlled oscillator;
    wherein the second signal is phase locked with the first output signal of the numerically controlled oscillator;
    wherein the second signal has a data rate that is a harmonic of the system clock signal.

11. A system for reducing digital loop dead zones, comprising:
    a phase detector coupled to a digital reference signal source;
    a low pass filter coupled to an output of the phase detector;
    a numerically controlled oscillator coupled between the low pass filter and the phase detector;
    a synchronizer coupled to an input of the phase detector; and
    a phase randomizer coupled to an input of the synchronizer.

12. The system according to claim 11, wherein the synchronizer is coupled between the numerically controlled oscillator and the phase detector, the phase randomizer comprising:

a frequency multiplier coupled to an output of the numerically controlled oscillator, the frequency multiplier configured to multiply the output of the numerically controlled oscillator by a factor of x; and a frequency divider coupled between the frequency multiplier and the synchronizer, the frequency divider configured to divide the output of the frequency multiplier by a factor of y;

wherein the system further comprises a frequency multiplier/divider coupled between the digital reference signal source and the phase detector, the frequency multiplier/divider configured to multiply/divide the digital reference signal by a factor of x/y.

13. The system according to claim 12, further comprising a second frequency divider to a second output of the numerically controlled oscillator, the second frequency divider configured to divide the second output of the numerically controlled oscillator by the factor x.

14. The system according to claim 12, wherein the synchronizer is coupled between the numerically controlled oscillator and the phase detector, and wherein the phase randomizer comprises a variable delay module coupled to an output of a source clock, wherein the variable delay module is controlled by a phase dither signal.

15. The system according to claim 11, wherein the synchronizer is coupled between the digital reference signal source and the phase detector, and wherein the phase randomizer is coupled to the digital reference signal source.

16. A method of controlling a digital phase locked loop, comprising:

receiving a system clock signal;

receiving a digital reference signal;

receiving a feedback signal;

wherein at least one of the digital reference signal and the feedback signal is asynchronous with the system clock signal;

randomizing a phase of the at least one asynchronous signal;

synchronizing the at least one randomized asynchronous signal with the system clock;

detecting a phase difference between synchronized signals, including the at least one randomized signal; and adjusting the feedback signal to reduce the phase difference.

* * * * *